(12) United States Patent
Hino et al.

(10) Patent No.: US 12,273,119 B2
(45) Date of Patent: Apr. 8, 2025

(54) ANALOG-TO-DIGITAL CONVERTER CIRCUIT AND SEMICONDUCTOR INTEGRATED CIRCUIT

(71) Applicant: Socionext Inc., Kanagawa (JP)

(72) Inventors: Shota Hino, Kanagawa (JP); Hidetaka Haneda, Kanagawa (JP)

(73) Assignee: SOCIONEXT INC., Yokohama (JP)

( * ) Notice: Subject to any disclaimer, the term of this patent is extended or adjusted under 35 U.S.C. 154(b) by 180 days.

(21) Appl. No.: 18/102,454

(22) Filed: Jan. 27, 2023

(65) Prior Publication Data

US 2023/0261663 A1    Aug. 17, 2023

(30) Foreign Application Priority Data

Feb. 15, 2022    (JP) ................. 2022-021562

(51) Int. Cl.
   *H03M 1/06*    (2006.01)
   *H03M 1/12*    (2006.01)
   *H03M 1/46*    (2006.01)

(52) U.S. Cl.
   CPC ....... *H03M 1/0604* (2013.01); *H03M 1/1245* (2013.01); *H03M 1/462* (2013.01); *H03M 1/468* (2013.01)

(58) Field of Classification Search
   CPC .. H03M 1/0604; H03M 1/1245; H03M 1/462; H03M 1/0845; H03M 1/468
   USPC .................. 341/118, 155, 161, 172
   See application file for complete search history.

(56) References Cited

U.S. PATENT DOCUMENTS

| | | | |
|---|---|---|---|
| 9,755,657 B2* | 9/2017 | Baek | H03M 1/466 |
| 9,935,643 B1* | 4/2018 | Chang | H03M 1/462 |
| 10,236,903 B2* | 3/2019 | Lin | H03M 1/468 |
| 11,637,554 B2* | 4/2023 | Markulic | H03F 3/265 |
| | | | 323/282 |
| 2009/0027247 A1 | 1/2009 | Kumamoto et al. | |
| 2015/0207518 A1 | 7/2015 | Liu et al. | |

FOREIGN PATENT DOCUMENTS

JP    2009-033303 A    2/2009

* cited by examiner

*Primary Examiner* — Khai M Nguyen
(74) *Attorney, Agent, or Firm* — Rimon P.C.

(57) ABSTRACT

An analog-to-digital converter circuit includes: a reference voltage node configured to be supplied with a reference voltage; an analog-to-digital converter circuit unit including a reference voltage input node configured to be electrically connected to the reference voltage node, the reference voltage being input to the reference voltage input node, the analog-to-digital converter circuit unit configured to convert an input analog voltage into a digital value based on the reference voltage; a voltage generation circuit configured to be electrically connected to the reference voltage node and generate an internal operating voltage based on the reference voltage; and a charge compensation circuit configured to operate based on the internal operating voltage, and during operation of the analog-to-digital converter circuit unit, the charge compensation circuit configured to compensate the reference voltage input node for charge.

20 Claims, 8 Drawing Sheets

F I G. 5
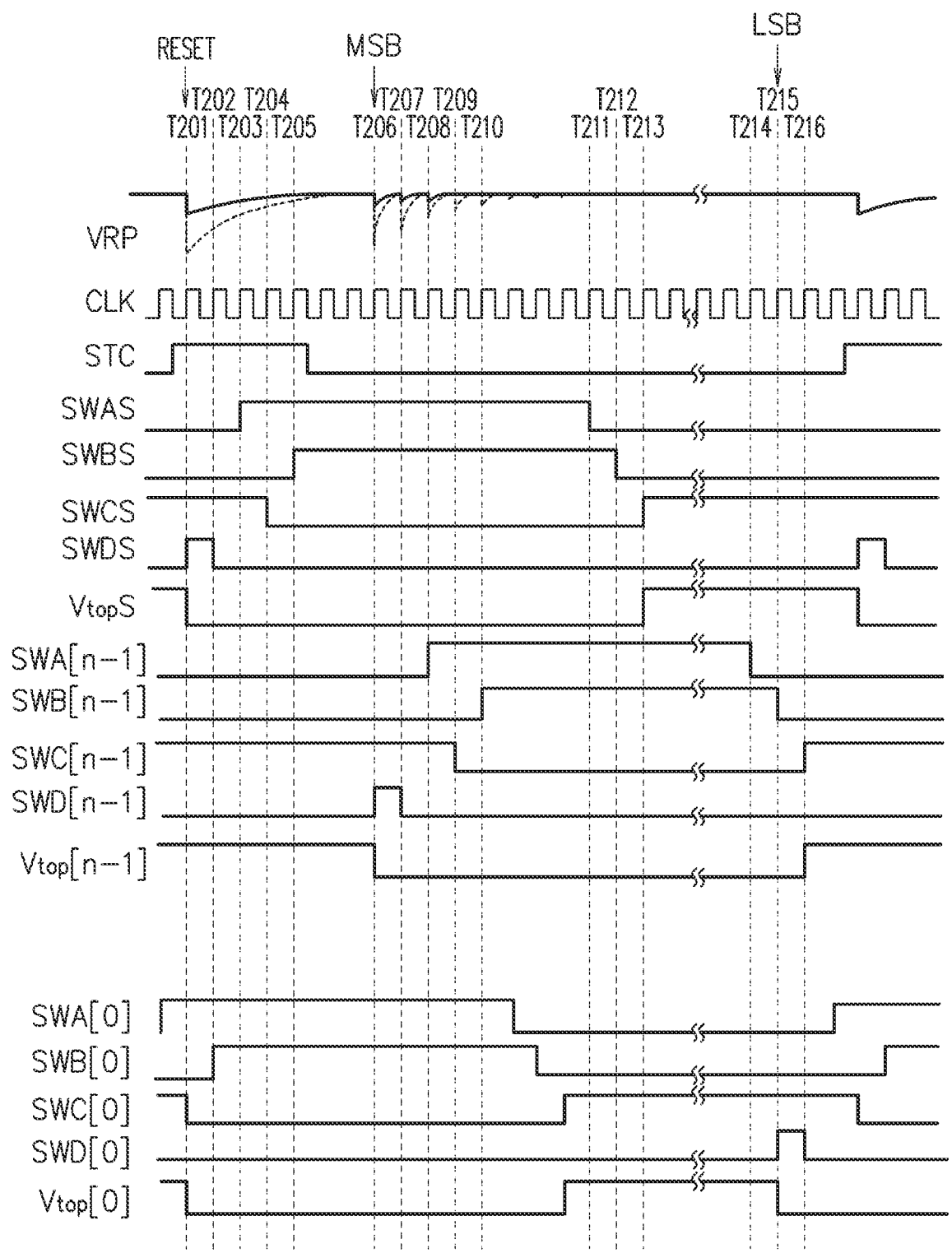

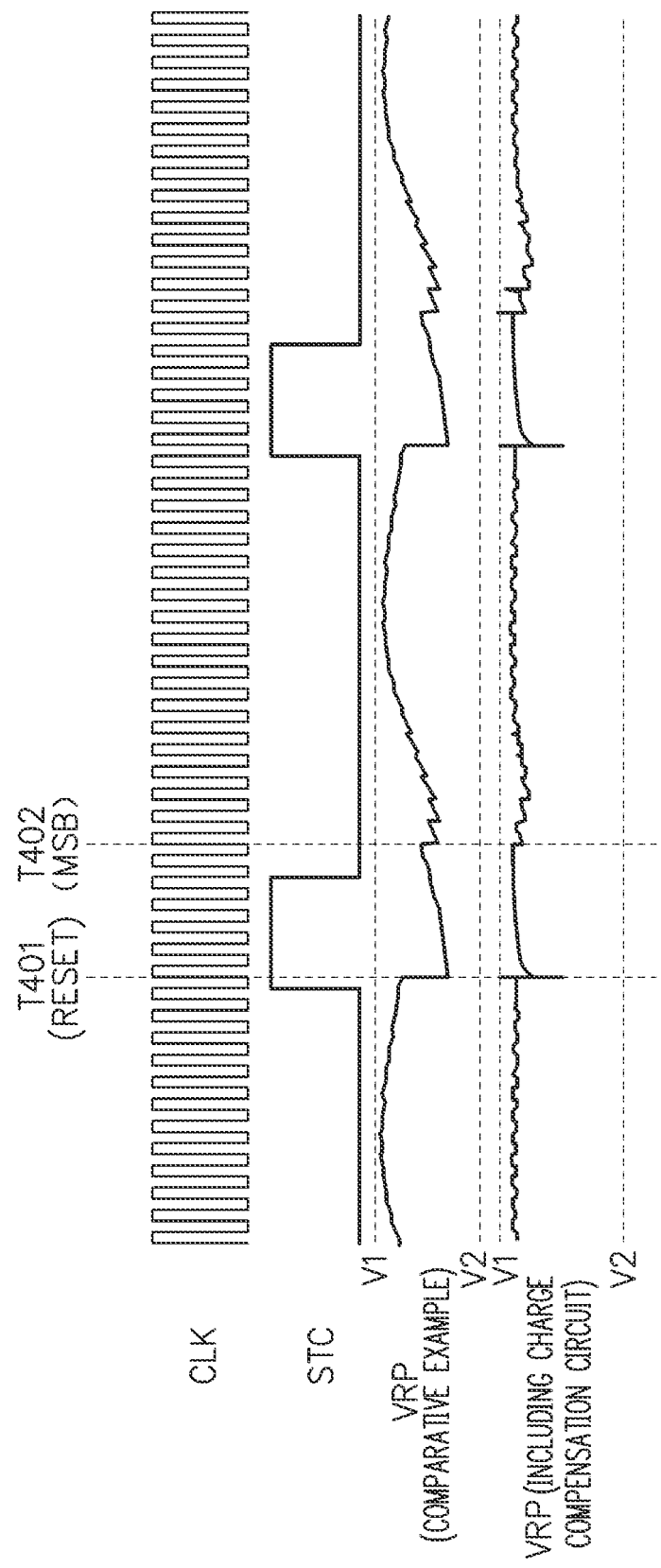

ANALOG-TO-DIGITAL CONVERTER CIRCUIT AND SEMICONDUCTOR INTEGRATED CIRCUIT

CROSS-REFERENCE TO RELATED APPLICATION

This application is based upon and claims the benefit of priority of the prior Japanese Patent Application No. 2022-021562, filed on Feb. 15, 2022, the entire contents of which are incorporated herein by reference.

FIELD

The embodiment discussed herein is directed to an analog-to-digital converter circuit and a semiconductor integrated circuit.

BACKGROUND

In a successive approximation register (SAR) type analog-to-digital (AD) converter circuit that converts an input analog voltage into a digital value, a reference voltage or 0 (zero) [V] is applied to each of capacitors of a capacitive digital-to-analog converter circuit (DAC) provided therein. When the connection state of a capacitor array is changed in the capacitive DAC during resetting or a comparison operation in the AD conversion operation, the charge accumulated in the capacitor at this time is consumed to be self-noise, affecting the reference voltage.

With reference to FIG. 9, there are explained voltage variations in the reference voltage in the SAR type AD converter circuit. VRP is a reference voltage at a reference voltage input node of the SAR type AD converter circuit. CLK is an operation clock signal of the SAR type AD converter circuit. STC is a control signal that controls the operation in the SAR type AD converter circuit. In the example illustrated in FIG. 9, the SAR type AD converter circuit samples an analog voltage in a sampling period SAMP and performs a comparison operation on the analog voltage in a comparison period CONV according to the control signal STC, to thereby convert the input analog voltage into a digital value.

At a time T501, the SAR type AD converter circuit, including the capacitive DAC, is reset to its initial state, and samples the input analog voltage. At a time T502, the SAR type AD converter circuit starts the comparison operation for determining a value of the most significant bit (MSB). The SAR type AD converter circuit thereafter sequentially starts the comparison operation for determining the value of each bit from the high-order side in order (at times T503, T504), and at a time T505, starts the comparison operation for determining a value of the least significant bit (LSB). At the timing of resetting or starting the comparison operation for each bit, the connection state of the capacitor array is changed in the capacitive DAC in the SAR type AD converter circuit, to thereby generate noise, causing the reference voltage VRP input to the reference voltage input node to vary as illustrated in FIG. 9 as an example.

[Patent Document 1] U.S. Patent Application Publication No. 2015/0207518
[Patent Document 2] Japanese Laid-open Patent Publication No. 2009-33303

As described previously, during resetting or the comparison operation in the AD conversion operation, the connection state of the capacitor array is changed in the capacitive DAC in the SAR type AD converter circuit, to thereby generate noise, causing the reference voltage input to the SAR type AD converter circuit to vary. As a method of inhibiting such voltage variations caused by the noise, there is a method of removing noise superimposed on the reference voltage by providing a bypass capacitor, what is called a pass con, outside or inside an integrated circuit in which the SAR type AD converter circuit is formed.

When it is not possible to provide terminals outside the integrated circuit in which the SAR type AD converter circuit is formed, it is not possible to use an external bypass capacitor. When the bypass capacitor is provided inside the integrated circuit in which the SAR type AD converter circuit is formed, in order to inhibit the self-noise and maintain the AD conversion accuracy, it is necessary to provide a capacitor having an appropriate size, which increases the circuit area. For example, in a 12-bit SAR type AD converter circuit, it is necessary to provide a bypass capacitor with a capacitance of about several hundred pF to several nF inside the integrated circuit, which increases the circuit area.

SUMMARY

One aspect of the analog-to-digital converter circuit includes: a reference voltage node configured to be supplied with a reference voltage; an analog-to-digital converter circuit unit including a reference voltage input node configured to be electrically connected to the reference voltage node, the reference voltage being input to the reference voltage input node, the analog-to-digital converter circuit unit configured to convert an input analog voltage into a digital value based on the reference voltage; a voltage generation circuit configured to be electrically connected to the reference voltage node and generate an internal operating voltage based on the reference voltage; and a charge compensation circuit configured to operate based on the internal operating voltage, and during operation of the analog-to-digital converter circuit unit, the charge compensation circuit configured to compensate the reference voltage input node for charge.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is a view explaining an operation of the charge compensation circuit illustrated in FIG. 4;

FIG. 7 is a view explaining voltage variations in a reference voltage in this embodiment;

DESCRIPTION OF EMBODIMENTS

Hereinafter embodiment will be described with reference to the drawings.

Figure 1:
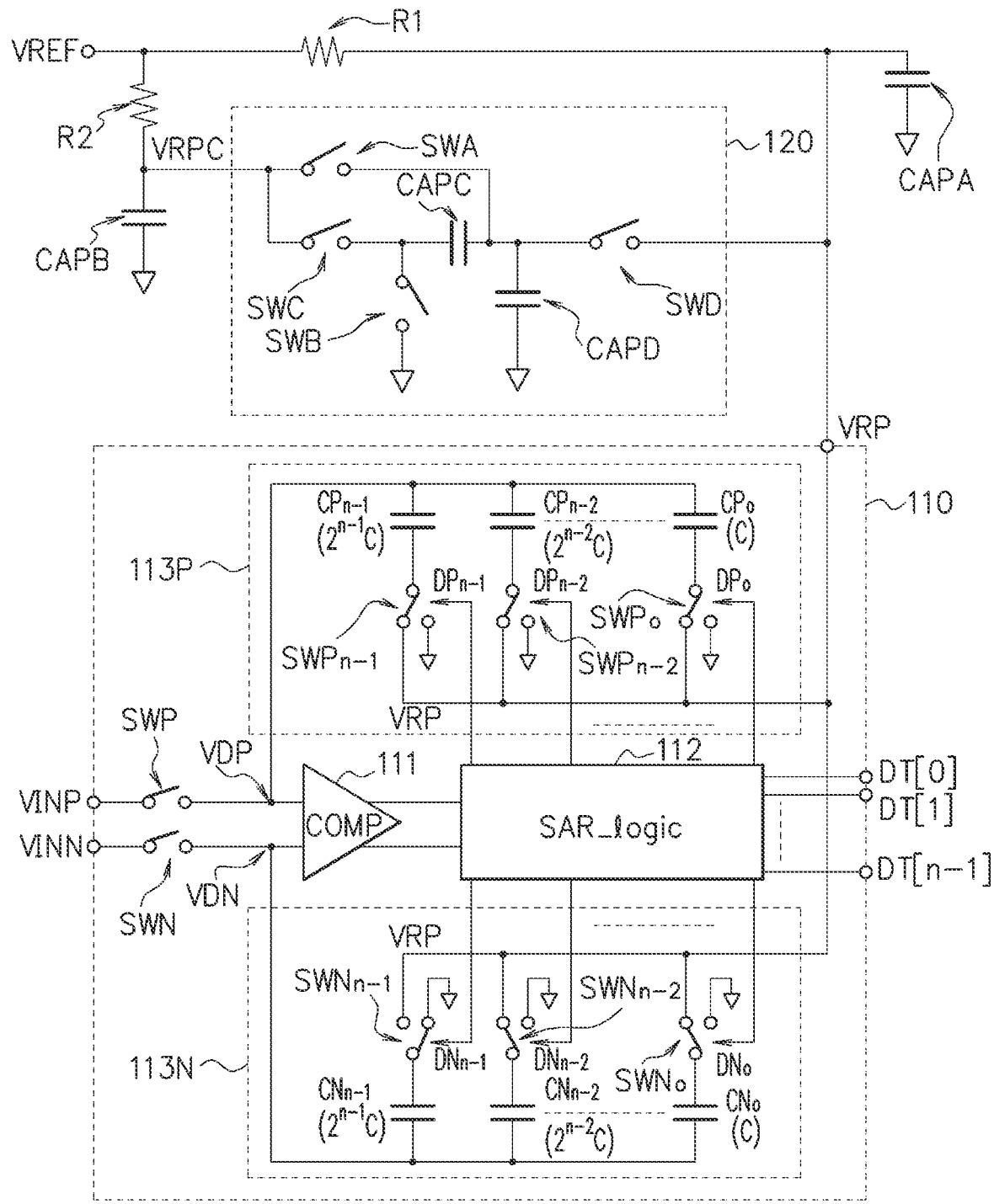
FIG. 1 is a diagram illustrating a configuration example of an analog-to-digital converter circuit in this embodiment.

FIG. 1 is a diagram illustrating a configuration example of an analog-to-digital (AD) converter circuit in this embodiment. The AD converter circuit in this embodiment is a successive approximation register (SAR) type AD converter circuit. FIG. 1 illustrates, as one example, an n-bit SAR type AD converter circuit that converts an input analog voltage into an n-bit (n being a natural number) digital value.

A SAR type AD converter circuit 100 in this embodiment includes an analog-to-digital (AD) converter circuit unit 110, a charge compensation circuit 120, resistors R1, R2, and capacitors CAPA, CAPB. VREF is a reference voltage node to which a reference voltage is supplied. VRPC is an internal operating voltage node that supplies an internal operating voltage. VRP is a reference voltage input node to which the reference voltage is input. VTNP and VINN each are an analog voltage input node to which an analog voltage is input. In this embodiment, the input of the analog voltage is in a differential input format, and the analog voltage input nodes VINP and VINN are complementary input nodes. DT[i] is an output node from which the i-th bit value of the digital value is output. A subscript "i" is an integer of i=0 to (n−1) (the same applies hereinafter).

One end of the resistor R1 is connected to the reference voltage node VREF and the other end of the resistor R1 is connected to the reference voltage input node VRP. The capacitor CAPA is a capacitor serving as a bypass capacitor, and is connected between the reference voltage input node VRP and a reference potential node. The reference potential node is a node to which a reference potential (ground level, ground potential, is supplied. The resistor R2 and the capacitor CAPB are connected in series between the reference voltage node VREF and the reference potential node, and a connection point between the resistor R2 and the capacitor CAPB is connected to the internal operating voltage node VRPC. Specifically, one end of the resistor R2 is connected to the reference voltage node VREF, and the other end of the resistor R2 is connected to one end of the capacitor CAPB. The other end of the capacitor CAPB is connected to the reference potential node. The connection point between the other end of the resistor R2 and one end of the capacitor CAPB is connected to the internal operating voltage node VRPC. The resistor R2 and the capacitor CAPB are an example of a voltage generation circuit. The capacitor CAPA serving as a bypass capacitor is preferably provided inside an integrated circuit in which it is formed as well as the other components of the SAR type AD converter circuit 100 (the AD converter circuit unit 110, the charge compensation circuit 120, the resistors R1, R2, and the capacitor CAPB), but it may also be provided outside the integrated circuit.

The AD converter circuit unit 110 converts the analog voltages input to the analog voltage input nodes VINP and VINN into n-bit digital values and outputs the n-bit digital values from the output nodes DT[0] to DT[n−1]. The AD converter circuit unit 110 includes switches SWP, SWN, a comparison circuit (comparator: COMP) 111, a control circuit (SAR_logic) 112, and capacitive digital-to-analog converter circuits (DAC) 113P, 113N.

The switch SWP has one end thereof connected to the analog voltage input node VINP and has the other end thereof connected to an internal node VDP. The switch SWN has one end thereof connected to the analog voltage input node VINN and has the other end thereof connected to an internal node VDN. The switches SWP and SWN are controlled to be on (closed state, conducting state)/off (open state, non-conducting state) based on a control signal from the control circuit 112. The comparison circuit 111 compares the voltage of the internal node VDP with the voltage of the internal node VDN, and outputs the comparison result.

The control circuit 112 controls the AD conversion operation in the AD converter circuit unit 110. The control circuit 112 controls the AD converter circuit unit 110 to sample the analog voltages in a sampling period SAMP and perform a comparison operation on the analog voltages in a comparison period CONV according to a generated control signal STC. For example, the control circuit 112 controls the switches SWP and SWN so that they are turned on (closed state, conducting state) in the sampling period SAMP and turned off (open state, non-conducting state) in the comparison period CONV by the control signal STC. Based on the comparison result output from the comparison circuit 111, the control circuit 112 sequentially determines the value of each bit of the digital value that is the conversion result of the analog voltage. The control circuit 112 controls connection states of capacitor arrays in the capacitive DACs 113P and 113N based on the comparison result output from the comparison circuit 111 (the value of each bit of the digital value determined sequentially) and the control signal STC.

The capacitive DAC 113P includes n capacitors $CP_i$ forming the capacitor array and switches $SWP_i$. Capacitance values of the n capacitors $CP_i$ are weighted by a binary ratio, and the capacitance value of the capacitor $CP_i$ is $2^i C$ (C is a unit capacitance value). For example, in the case of the 10-bit AD converter circuit unit 110, the capacitive DAC 113P includes ten capacitors $CP_0$ to $CP_9$ having capacitance values of C, 2C, 4C, 8C, 16C, 32C, 64C, 128C, 256C, and 512C. Each capacitor $CP_i$ has one end (top plate) thereof connected to the internal node VDP, and has the other end (bottom plate) thereof connected to one end of the switch $SWP_i$. The switch $SWP_i$ is controlled based on a control signal $DP_i$ from the control circuit 112, and the other end of the switch $SWP_i$ is selectively connected to either the reference voltage input node VRP or the reference potential node according to the control signal $DP_i$. That is, to the other end (bottom plate) of each capacitor $CP_i$, the reference voltage input to the reference voltage input node VRP or the reference potential (ground level, ground potential) is supplied according to the control signal $DP_i$.

The capacitive DAC 113N includes n capacitors $CN_i$ forming the capacitor array and switches $SWN_i$. Capacitance values of the n capacitors $CN_i$ are weighted by a binary ratio, and the capacitance value of the capacitor $CN_i$ is $2^i C$ (C is a unit capacitance value). Each capacitor $CN_i$ has one end (top plate) thereof connected to the internal node VDN, and has the other end (bottom plate) thereof connected to one end of the switch $SWN_i$. The switch $SWN_i$ is controlled based on a control signal $DN_i$ from the control circuit 112, and the other end of the switch $SWN_i$ is selectively connected to either the reference voltage input node VRP or the reference potential node according to the control signal $DN_i$. That is, to the other end (bottom plate) of each capacitor $CN_i$, the reference voltage input to the reference voltage input node VRP or the reference potential (ground level, ground potential) is supplied according to the control signal $DN_i$.

There is explained the AD conversion operation in the AD converter circuit unit 110. In response to the control signal STC, the AD converter circuit unit 110 performs a sampling operation of the analog voltages in the sampling period SAMP and performs a comparison operation on the analog voltages in the comparison period CONV to sequentially determine the value of each bit of the digital value.

Specifically, in the sampling period SAMP, the control circuit 112 controls the switches SWP and SWN to turn them on (closed state, conducting state). Further, the control circuit 112 performs a control to have the other ends of the switches $SWP_0$ to $SWP_{n-2}$ connected to the reference potential node and have the other end of the switch $SWP_{n-1}$ connected to the reference voltage input node VRP in the capacitive DAC 113P. Further, the control circuit 112 performs a control to have the other ends of the switches $SWN_0$ to $SWN_{n-2}$ connected to the reference voltage input node VRP and have the other end of the switch $SWN_{n-1}$ connected to the reference potential node in the capacitive DAC 113N. In this manner, the AD converter circuit unit 110 samples the analog voltages input to the analog voltage input nodes VINP and VINN. After sampling the analog voltages, the control circuit 112 controls the switches SWP and SWN to turn them off (open state, non-conducting state).

In the comparison period CONV after the sampling period SAMP, a comparison operation is first performed to determine the value of the (n−1)th bit, which is the most significant bit (MSB) of the digital value. At this time, the control circuit 112 performs a control to have the other ends of the switches $SWP_0$ to $SWP_{n-2}$ connected to the reference potential node and have the other end of the switch $SWP_{n-1}$ connected to the reference voltage input node VRP in the capacitive DAC 113P. Further, the control circuit 112 performs a control to have the other ends of the switches $SWN_0$ to $SWN_{n-2}$ connected to the reference voltage input node VRP and have the other end of the switch $SWN_{n-1}$ connected to the reference potential node in the capacitive DAC 113N. In this state, the comparison circuit 111 compares the voltage of the internal node VDP with the voltage of the internal node VDN, and based on the comparison result, the control circuit 112 determines the value of the (n−1)th bit.

After determining the value of the (n−1)th bit of the digital value, a comparison operation is then performed to determine the value of the (n−2)th bit, which is the second bit from the high-order side, of the digital value. At this time, the control circuit 112 performs a control to have the other ends of the switches $SWP_0$ to $SWP_{n-3}$ connected to the reference potential node, have the other end of the switch $SWP_{n-2}$ connected to the reference voltage input node VRP, and have the other end of the switch $SWP_{n-1}$ connected to the reference voltage input node VRP or the reference potential node according to the determined value of the (n−1)th bit in the capacitive DAC 113P. Further, the control circuit 112 performs a control to have the other ends of the switches $SWN_0$ to $SWN_{n-3}$ connected to the reference voltage input node VRP, have the other end of the switch $SWN_{n-2}$ connected to the reference potential node, and have the other end of the switch $SWN_{n-1}$ connected to the reference potential node or the reference voltage input node VRP according to the determined value of the (n−1)th bit in the capacitive DAC 113N. In this state, the comparison circuit 111 compares the voltage of the internal node VDP with the voltage of the internal node VDN, and based on the comparison result, the control circuit 112 determines the value of the (n−2)th bit.

Thereafter, by sequentially determining the values of the (n−3)th bit, the (n−4)th bit, . . . , the 1st bit, and the 0th bit in the same manner, the AD converter circuit unit 110 converts the analog voltages input to the analog voltage input nodes VINP and VINN into n-bit digital values.

Next, there is explained the charge compensation circuit 120. The charge compensation circuit 120 compensates the reference voltage input node VRP for the charge for inhibiting the voltage variations in the input reference voltage during the AD conversion operation in the AD converter circuit unit 110 described above. Although one charge compensation circuit 120 is illustrated in FIG. 1 for convenience of explanation, the charge compensation circuit 120 is provided for each of sampling and a comparison operation, as will be described later. As for the charge compensation circuit 120 for comparison operation, the charge compensation circuit is provided so as to correspond to the bit of the digital value.

The charge compensation circuit 120 includes four switches SWA, SWB, SWC, and SWD and two capacitors CAPC and CAPD. The switch SWA has one end thereof connected to one end (top plate) of the capacitor CAPC and has the other end thereof connected to the internal operating voltage node VRPC. The switch SWB has one end thereof connected to the other end (bottom plate) of the capacitor CAPC and has the other end thereof connected to the reference potential node. The switch SWC has one end thereof connected to the other end (bottom plate) of the capacitor CAPC and has the other end thereof connected to the internal operating voltage node VRPC. The switch SWD has one end thereof connected to one end (top plate) of the capacitor CAPC and has the other end thereof connected to the reference voltage input node VRP. The capacitor CAPD has one end thereof connected to a connection point between one end of the capacitor CAPC and one end of the switch SWD, and has the other end thereof connected to the reference potential node.

Here, the capacitor CAPD has a sufficiently large capacitance value relative to the capacitor CAPC so that the potential of one end (top plate) of the capacitor CAPC does not exceed the withstand voltage of a transistor in the AD converter circuit unit 110. The on-resistance of the switch SWD in the charge compensation circuit 120 is set to a resistance value sufficiently smaller than that of the resistor R1. The resistor R2 is set to a resistor having a sufficiently large resistance value (for example, about several kΩ) in order to suppress the influence of the voltage variations at the internal operating voltage node VRPC on the reference voltage node VREF.

Figure 2A:
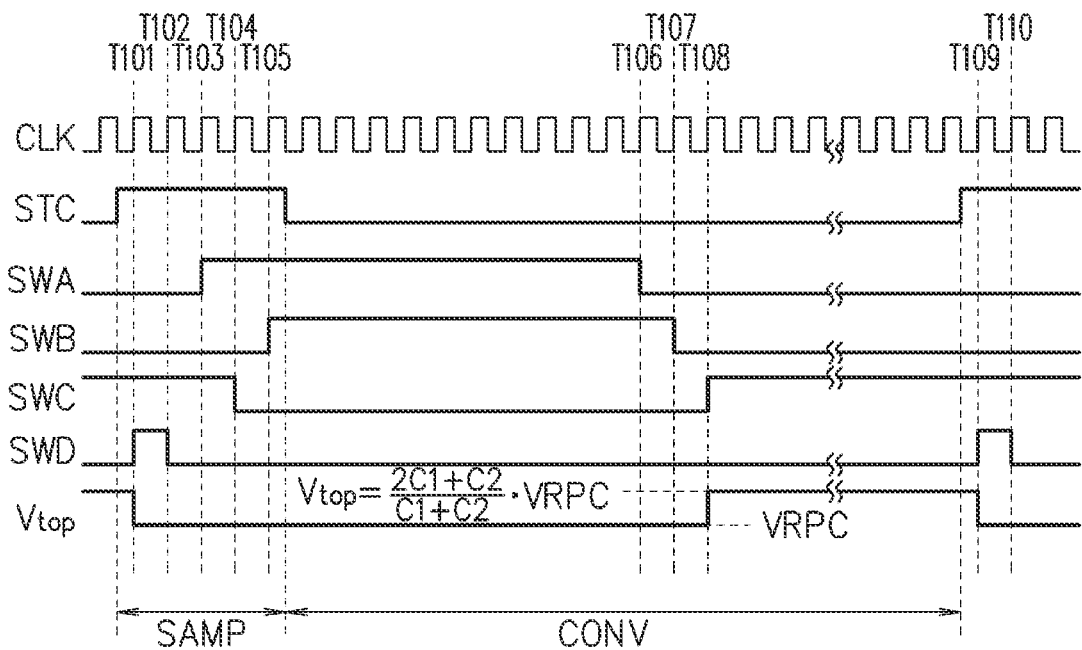
FIG. 2A is a view explaining an operation of a charge compensation circuit.
Figure 2B:
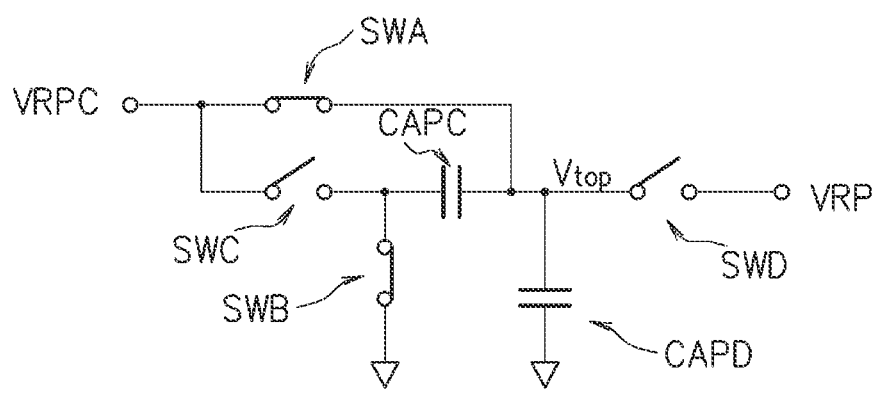
FIG. 2B is a diagram explaining the operation of the charge compensation circuit.
Figure 2C:
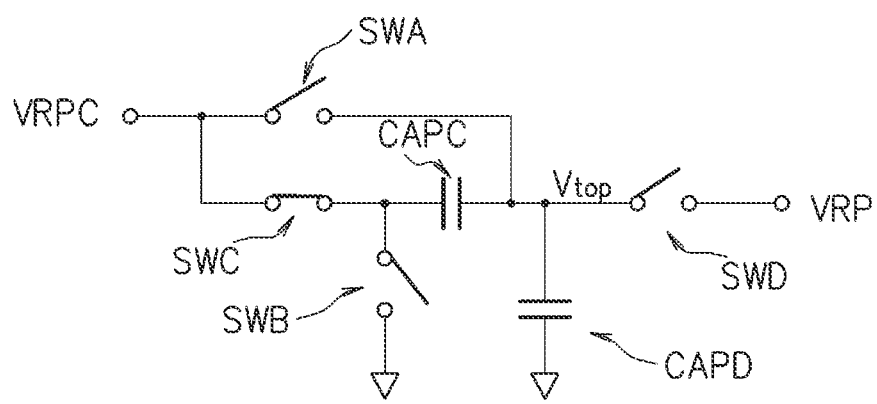
FIG. 2C is a diagram explaining the operation of the charge compensation circuit.

There is explained the operation of the charge compensation circuit 120 with reference to FIG. 2A to FIG. 2C. Here, the operation is explained by taking, as an example, the charge compensation circuit 120 for sampling that compensates the reference voltage input node VRP for charge during the sampling operation of the analog voltage. FIG. 2A is a timing chart illustrating an operation example of the charge compensation circuit 120. CLK is a clock signal. STC is a control signal relating to the AD conversion operation, which is generated in the control circuit 112. SWA, SWB, SWC, and SWD indicate the states of the switches SWA, SWB, SWC, and SWD included in the charge compensation circuit 120. A high level indicates on (closed state, conducting state), and a low level indicates off (open state, non-conducting state). $V_{top}$ is the voltage at one end (top plate) of the capacitor CAPC included in the charge compensation circuit 120. In the following explanation, the capacitance value of the capacitor CAPC is set to C1, the capacitance value of the capacitor CAPD is set to C2, and the voltage of the internal operating voltage node VRPC is set to VRPC.

At a time T101, the switch SWD is turned on in response to changing the connection state of the capacitor array in order to reset the states of the capacitive DACs 113P and 113N of the AD converter circuit unit 101, and one end (top plate) of the capacitor CAPC is connected to the reference voltage input node VRP. As a result, the charge accumulated in the charge compensation circuit 120 by the operation before the time T101 is supplied from one end (top plate) of the capacitor CAPC to the reference voltage input node VRP, and the charge compensation circuit 120 can compensate for the charge lost by the reference voltage input node VRP due to the change in the connection state of the capacitor array. Thereafter, at a time T102, the switch SWD is turned off.

Then, in the charge compensation circuit 120, an operation to compensate the capacitor CAPC for charge from the internal operating voltage node VRPC is performed. First, at a time T103, the switch SWA is turned on, at a time T104, the switch SWC is turned off, and then, at a time T105, the switch SWB is turned on. FIG. 2B illustrates the state of the charge compensation circuit 120 at this time. In the state illustrated in FIG. 2B, when the charge at one end (top plate) of the capacitor CAPC is $Q_{top1}$, $Q_{top1}=\text{VRPC}\cdot(C1+C2)$ is established.

Then, after a predetermined time has elapsed, at a time T106, the switch SWA is turned off, at a time T107, the switch SWB is turned off, and then, at a time T108, the switch SWC is turned on. FIG. 2C illustrates the state of the charge compensation circuit 120 at this time. In the state illustrated in FIG. 2C, when the charge at one end (top plate) of the capacitor CAPC is $Q_{top2}$, $Q_{top2}=(V_{top}-\text{VRPC})\cdot C1 + V_{top}\cdot C2$ is established.

In the state illustrated in FIG. 2B and the state illustrated in FIG. 2C, the charge at one end of the capacitor CAPC is preserved and $Q_{top1}=Q_{top2}$ is established, and thus the following is established.

$$V_{top}=((2C1+C2)/(C1+C2))\cdot \text{VRPC}$$

During resetting in the next AD conversion operation, at a time T109, the switch SWD is turned on in the same manner as at the time T101, and one end (top plate) of the capacitor CAPC is connected to the reference voltage input node VRP. As a result, the charge accumulated in the charge compensation circuit 120 as described above is supplied from one end (top plate) of the capacitor CAPC to the reference voltage input node VRP. In this manner, the charge compensation circuit 120 can compensate for the charge lost by the reference voltage input node VRP due to a change in the connection state of the capacitor array in the AD converter circuit unit 101. Thereafter, at a time T110, the switch SWD is turned off.

In the above explanation, the switches SWA, SWB, and SWC are controlled to be turned on/off at different timings from each other. However, this embodiment is not limited to this, and in order to prevent at least the switches SWB and SWC from being turned on at the same time, it is only necessary to control the switches SWB and SWC to turn one of the switches SWB and SWC on after turning both the switches SWB and SWC off. For example, the switch SWA and the switch SWB may be controlled to be turned on/off at the same timing, or the switch SWA and the switch SWC may be controlled to be turned on/off at the same timing.

Figure 3:
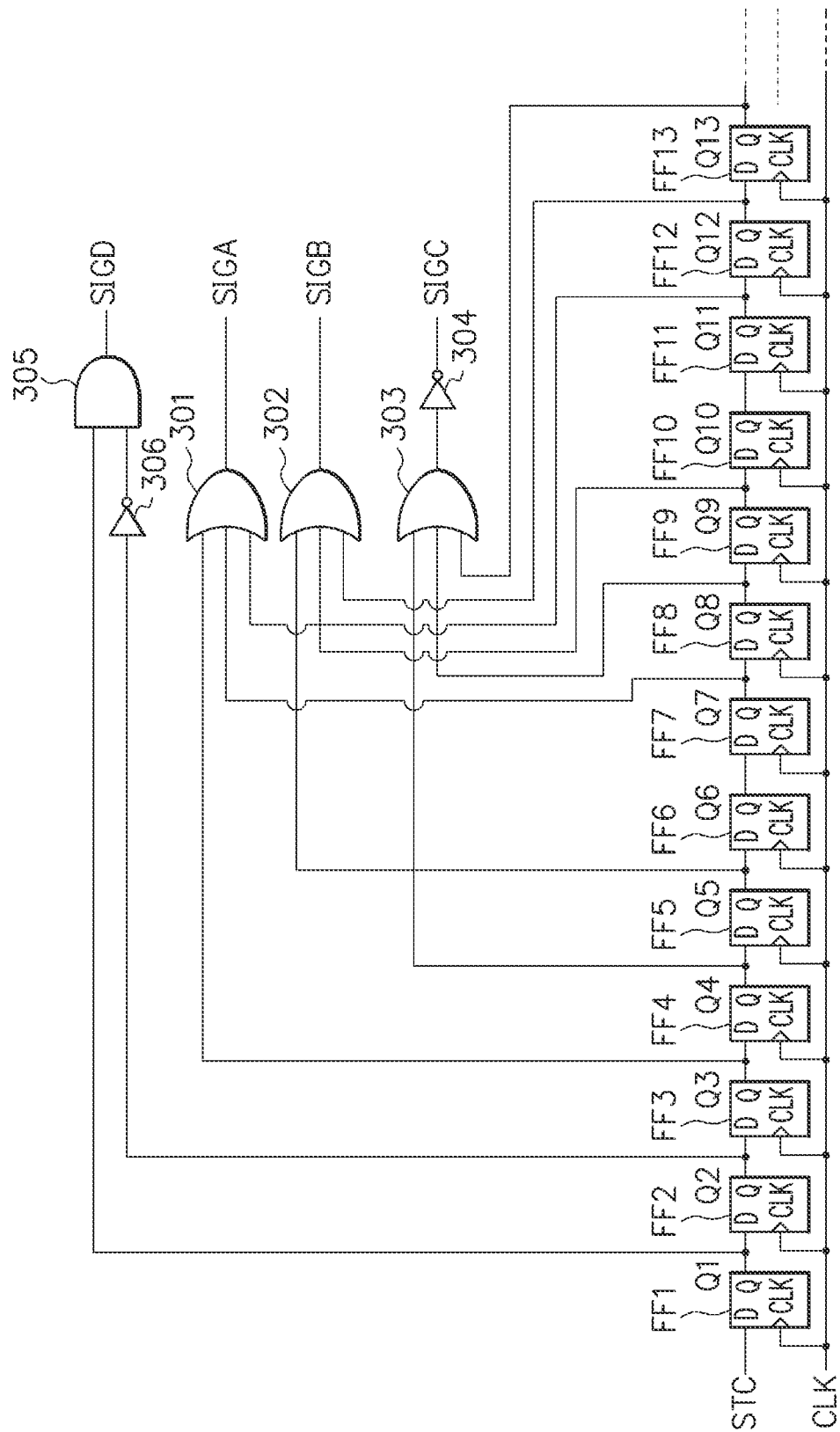
FIG. 3 is a diagram illustrating a configuration example of a switch control circuit.

A switch control circuit that controls the switches SWA, SWB, SWC, and SWD included in the charge compensation circuit 120 can be configured using, for example, a shift register in which a plurality of flip-flops are connected in cascade and logic circuits. FIG. 3 illustrates an example of the switch control circuit that controls the switches SWA, SWB, SWC, and SWD as illustrated in FIG. 2A. The switch control circuit illustrated in FIG. 3 is included in the SAR type AD converter circuit 100, for example.

The switch control circuit illustrated in FIG. 3 includes a plurality of flip-flops (FF) configuring a shift register and logic circuits 301 to 306. A plurality of the flip-flops are connected in cascade so as to connect a data output (Q) of the flip-flop in the previous stage and a data input (D) of the flip-flop in the subsequent stage. The control signal STC generated by the control circuit 112 is input to a data input (D) of the flip-flop (FF1) in the first stage. In this example, the control signal STC goes to a high level (corresponding to the sampling period SAMP) for a period of 5 cycles of the clock signal CLK, and the subsequent low level period (corresponding to the comparison period CONV) is sufficiently long relative to the high level period.

Data outputs Q3, Q7, and Q11 of the flip-flops FF3, FF7, and FF11 in the 3rd stage, the 7th stage, and the 11th stage from the first stage are input to a logical sum operation circuit (OR circuit) 301. The operation result of the data outputs Q3, Q7, and Q11 in the OR circuit 301 is output as a control signal SIGA that controls the switch SWA. Data outputs Q5, Q9, and Q12 of the flip-flops FF5, FF9, and FF12 in the 5th stage, the 9th stage, and the 12th stage from the first stage are input to an OR circuit 302. The operation result of the data outputs Q5, Q9, and Q12 in the OR circuit 302 is output as a control signal SIGB that controls the switch SWB.

Data outputs Q4, Q8, and Q13 of the flip-flops FF4, FF8, and FF13 in the 4th stage, the 8th stage, and the 13th stage from the first stage are input to an OR circuit 303. A signal obtained by inverting the operation result of the data outputs Q4, Q8, and Q13 in the OR circuit 303 by an inverter 304 is output as a control signal SIGC that controls the switch SWC. To a logical product operation circuit (AND circuit) 305, the data output Q1 of the flip-flop FF1 in the first stage and a signal obtained by inverting the data output Q2 of the flip-flop FF2 in the 2nd stage from the first stage by an inverter 306 are input. The operation result of the data output Q1 and the inverted data output Q2 in the AND circuit 305 is output as a control signal SIGD that controls the switch SWD.

Thus, the switch control circuit illustrated in FIG. 3 can generate a control signal that goes to a high level in the 3rd cycle of the clock signal CLK after rising of the control signal STC and goes to a low level in the 16th cycle of the clock signal CLK after rising of the control signal STC, by using the data outputs Q3, Q7, and Q11 in the 3rd stage, the 7th stage, and the 11th stage of the shift register composed of a plurality of the flip-flops, and can control the switch SWA as illustrated in FIG. 2A. Further, the switch control circuit illustrated in FIG. 3 can generate a control signal that goes to a high level in the 5th cycle of the clock signal CLK after rising of the control signal STC and goes to a low level in the 17th cycle of the clock signal CLK after rising of the control signal STC, by using the data outputs Q5, Q9, and Q12 in the 5th stage, the 9th stage, and the 12th stage of the shift register, and can control the switch SWB as illustrated in FIG. 2A.

The switch control circuit illustrated in FIG. 3 can generate a control signal that goes to a low level in the 4th cycle of the clock signal CLK after rising of the control signal STC and goes to a high level in the 18th cycle of the clock signal CLK after rising of the control signal STC, by using the data outputs Q4, Q8, and Q13 in the 4th stage, the 8th stage, and the 13th stage of the shift register, and can control the switch SWC as illustrated in FIG. 2A. The switch control circuit illustrated in FIG. 3 can generate a pulsed control signal that goes to a high level in the 1st cycle of the clock signal CLK after rising of the control signal STC and goes to a low level in the 2nd cycle of the clock signal CLK after rising of the control signal STC, by using the data outputs Q1 and Q2 in the 1st stage and the 2nd stage of the shift register, and can control the switch SWD as illustrated in FIG. 2A.

FIG. 3 has illustrated the example of the switch control circuit that controls the switches SWA, SWB, SWC, and SWD included in the charge compensation circuit 120 for sampling as illustrated in FIG. 2A. The switch control circuit that controls the switches SWA, SWB, SWC, and SWD included in the charge compensation circuit 120 for comparison operation can also be configured in the same manner. By appropriately selecting and changing the outputs of the shift register (data outputs of a plurality of the flip-flops) to be input to the respective logic circuits according to the timing of on/off control of the switches SWA, SWB, SWC, and SWD included in the charge compensation circuit 120 for comparison operation, the control signals that on/off control the switches SWA, SWB, SWC, and SWD can be generated from the control signal STC generated by the control circuit 112.

Thus, the control signals that on/off control the switches SWA, SWB, SWC, and SWD included in the charge compensation circuit 120 can be generated from the control signal STC generated by the control circuit 112 using the shift register and the logic circuits. The switch control circuit that controls the switches SWA, SWB, SWC, and SWD included in the charge compensation circuit 120 may be provided inside the control circuit 112, or may be provided as a circuit separate from the control circuit 112. The switch control circuit that controls the switches SWA, SWB, SWC, and SWD included in the charge compensation circuit 120 is not limited to the one using the shift register and the logic circuits described above, and can be fabricated by any combination of logic circuits.

Figure 4:
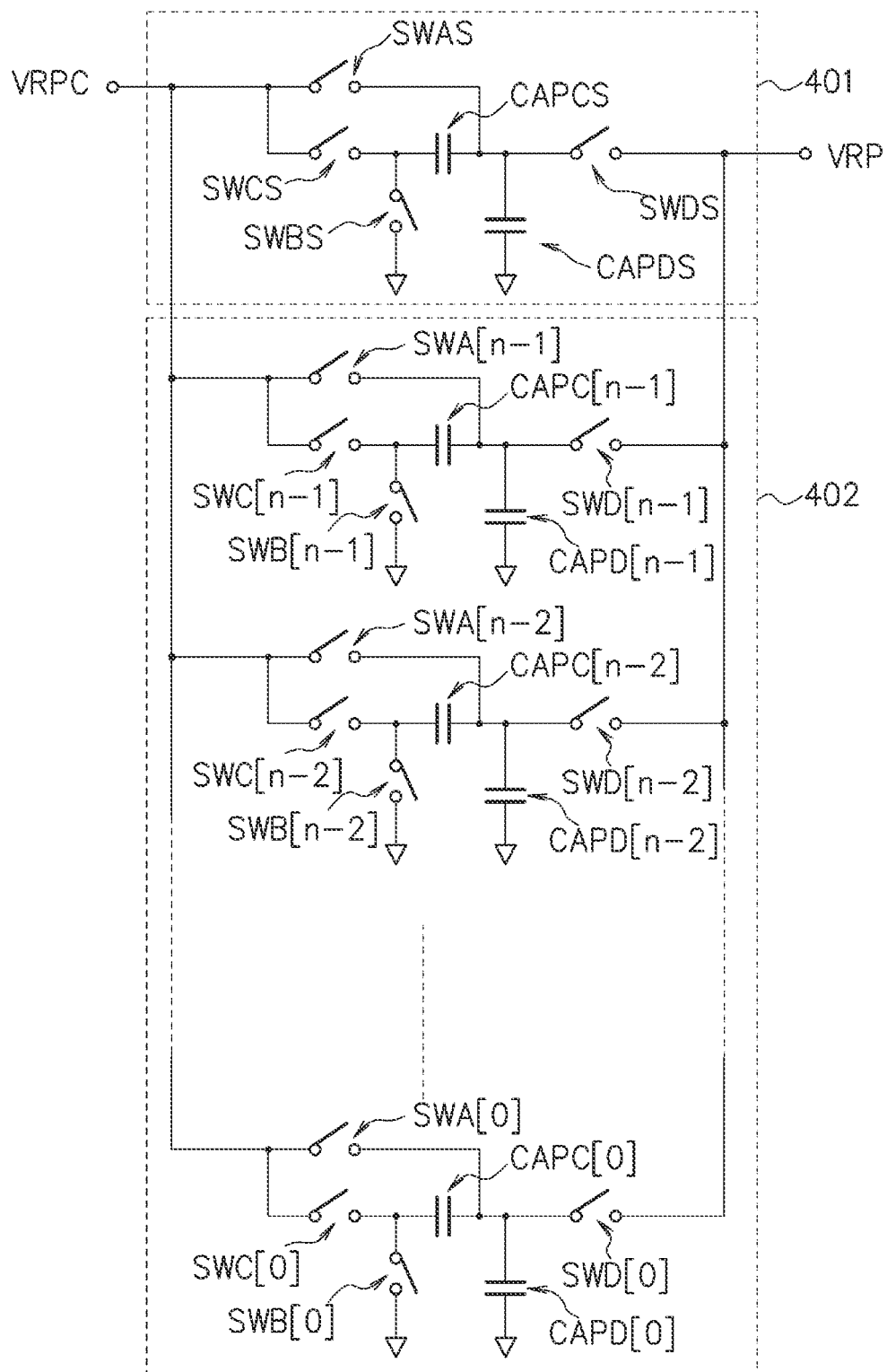
FIG. 4 is a diagram illustrating a configuration example of the charge compensation circuit.

FIG. 4 is a diagram illustrating a configuration example of the charge compensation circuit 120 included in the SAR type AD converter circuit in this embodiment. Variations in the reference voltage to be input to the SAR type AD converter circuit may occur during the sampling operation and during the comparison operation of each bit, and the amount of variations also differs. Therefore, as described above, the SAR type AD converter circuit in this embodiment includes a charge compensation circuit 401 for sampling intended for inhibiting the variations in the reference voltage during the sampling operation of the analog voltages and a charge compensation circuit 402 for comparison operation intended for inhibiting the variations in the reference voltage during the comparison operation on the analog voltages.

The charge compensation circuit 401 for sampling includes four switches SWAS, SWBS, SWCS, and SWDS, and two capacitors CAPCS and CAPDS. The switches SWAS, SWBS, SWCS, and SWDS correspond to the switches SWA, SWB, SWC, and SWD in the charge compensation circuit 120 illustrated in FIG. 1, respectively. The capacitors CAPCS and CAPDS correspond to the capacitors CAPC and CAPD in the charge compensation circuit 120 illustrated in FIG. 1, respectively. The circuit configuration (connection of the switches SWAS, SWBS, SWCS, and SWDS, and the capacitors CAPCS and CAPDS, or the like) in the charge compensation circuit 401 for sampling is the same as that of the charge compensation circuit 120 illustrated in FIG. 1, and thus, the explanation of the circuit configuration is omitted.

The charge compensation circuit 402 for comparison operation includes a plurality of basic circuits, each of the basic circuits including four switches SWA[i], SWB[i], SWC[i], and SWD[i] and two capacitors CAPC[i] and CAPD[i], corresponding to the i-th bit of the digital value, and these basic circuits having the same circuit configuration as each other are connected in parallel between the internal operating voltage node VRPC and the reference voltage input node VRP. The switches SWA[i], SWB[i], SWC[i], and SWD[i] of the basic circuit corresponding to the i-th bit of the digital value correspond to the switches SWA, SWB, SWC, and SWD in the charge compensation circuit 120 illustrated in FIG. 1, respectively. The capacitors CAPC[i] and CAPD[i] of the basic circuit corresponding to the i-th bit of the digital value correspond to the capacitors CAPC and CAPD in the charge compensation circuit 120 illustrated in FIG. 1, respectively. The circuit configuration (connection of the switches SWA[i], SWB[i], SWC[i], and SWD[i], and the capacitors CAPC[i] and CAPD[i], or the like) in each of the basic circuits in the charge compensation circuit 402 for comparison operation is the same as that of the charge compensation circuit 120 illustrated in FIG. 1, and thus, the explanation of the circuit configuration is omitted.

Since the amount of variations in the reference voltage varies depending on the time of sampling and the time of comparison operation of each bit as described above, the capacitance value of the capacitor CAPC and the capacitance value of the capacitor CAPC[i] are set appropriately for each corresponding operation or bit, according to the amount of variations in the reference voltage.

Next, there are explained operations of the charge compensation circuits 401, 402 illustrated in FIG. 4 with reference to FIG. 5. FIG. 5 is a timing chart illustrating operation examples of the charge compensation circuits 401, 402 illustrated in FIG. 4. VRP is a reference voltage to be input to the reference voltage input node VRP. CLK is a clock signal. STC is a control signal relating to the AD conversion operation generated by the control circuit 112. SWAS, SWBS, SWCS, and SWDS indicate the states of the switches SWAS, SWBS, SWCS, and SWDS included in the charge compensation circuit 401 for sampling. $V_{top}S$ is the voltage at one end (top plate; of the capacitor CAPCS. SWA[i], SWB[i], SWC[i], and SWD[i] indicate the states of the switches SWA[i], SWB[i], SWC[i], and SWD[i] included in the charge compensation circuit 402 for comparison operation. $V_{top}[i]$ is the voltage at one end (top plate) of the capacitor CAPC[i]. As for the state of each switch, a high level indicates on (closed state, conducting state), and a low level indicates off (open state, non-conducting state).

At a time T201 when sampling of the analog voltage is started, the switch SWDS included in the charge compensation circuit 401 for sampling is turned on, and one end (top plate) of the capacitor CAPCS is connected to the reference voltage input node VRP, and thereby, the charge accumulated in the charge compensation circuit 401 for sampling is supplied from one end (top plate) of the capacitor CAPCS to the reference voltage input node VRP. As a result, the charge compensation circuit 401 for sampling compensates for the charge consumed by the reference voltage input node VRP at the time of resetting, to inhibit the variations in the reference voltage to be input to the AD converter circuit unit 101. Thereafter, at a time T202, the switch SWDS is turned off.

Thereafter, in the charge compensation circuit 401 for sampling, at a time T203, the switch SWAS is turned on, at a time T204, the switch SWCS is turned off, and then at a time T205, the switch SWBS is turned on. By controlling the switches SWAS, SWBS, and SWCS respectively in this manner, the capacitor CAPCS included in the charge compensation circuit 401 for sampling is compensated for the charge from the internal operating voltage node VRPC.

At a time T206 when the comparison operation on the MSB of the digital value is started, the switch SWD[n−1] included in the charge compensation circuit 402 for comparison operation is turned on, and one end (top plate) of the capacitor CAPC[n−1] is connected to the reference voltage input node VRP, and thereby, the charge accumulated in the charge compensation circuit 402 for comparison operation is supplied from one end (top plate) of the capacitor CAPC[n−1] to the reference voltage input node VRP. As a result, the charge compensation circuit 402 for comparison operation compensates for the charge consumed by the reference voltage input node VRP at the time of the comparison operation on the MSB, to inhibit the variations in the reference voltage to be input to the AD converter circuit unit 101. Thereafter, at a time T207, the switch SWD[n−1] is turned off.

Thereafter, in the charge compensation circuit 402 for comparison operation, at a time T208, the switch SWA[n−1] is turned on, at a time T209, the switch SWC[n−1] is turned off, and then at a time T210, the switch SWB[n−1] is turned on. By controlling the switches SWA[n−1], SWB[n−1], and SWC[n−1] respectively in this manner, the capacitor CAPC[n−1] included in the charge compensation circuit 402 for comparison operation is compensated for the charge from the internal operating voltage node VRPC.

After a predetermined period of time has elapsed since the operation to compensate the capacitor CAPCS included in the charge compensation circuit 401 for sampling for the charge from the internal operating voltage node VRPC, in the charge compensation circuit 401 for sampling, at a time T211, the switch SWAS is turned off, at a time T212, the switch SWBS is turned off, and then, at a time T213, the switch SWCS is turned on. The switches SWAS, SWBS, and SWCS are controlled in this manner, respectively, to finish the operation to compensate the capacitor CAPCS included in the charge compensation circuit 401 for sampling for charge.

After a predetermined period of time has elapsed since the operation to compensate the capacitor CAPC[n−1] included in the charge compensation circuit 402 for comparison operation for the charge from the internal operating voltage node VRPC, in the charge compensation circuit 402 for comparison operation, at a time T214, the switch SWA[n−1] is turned off, at a time T215, the switch SWB[n−1] is turned off, and then at a time T216, the switch SWC[n−1] is turned on in the same manner. The switches SWA[n−1], SWB[n−1], and SWC[n−1] are controlled in this manner, respectively, to finish the operation to compensate the capacitor CAPC[n−1] included in the charge compensation circuit 402 for comparison operation for charge.

For the (n−2)th bit through the 0th bit of the digital value, the switches SWA[i], SWB[i], SWC[i], and SWD[i] are each controlled in the same manner as the comparison operation on the MSB of the digital value. In this way, the charge compensation circuit 402 for comparison operation compensates for the charge consumed by the reference voltage input node VRP, to inhibit the variations in the reference voltage to be input to the AD converter circuit unit 101.

By providing the charge compensation circuit 401 for sampling and the charge compensation circuit 402 for comparison operation in this manner, the variations in the reference voltage that occur during the sampling operation of the analog voltage and the variations in the reference voltage that occur during the comparison operation on the analog voltage each can be inhibited.

In the above-described example, the charge compensation circuit 402 for comparison operation, which includes n basic circuits provided to correspond to the 0th bit through the (n−1)th bit of the digital value, has been explained as an example. However, the amount of variations in the reference voltage during the comparison operation becomes larger at the MSB of the digital value and becomes smaller toward the LSB side of the digital value, and thus, a basic circuit corresponding to a predetermined number of bits from the high-order side of the digital value may be provided without providing the basic circuits corresponding to respective bits of the digital value. That is, the charge compensation circuit 402 for comparison operation may be configured so that a basic circuit corresponding to a predetermined number of bits from the high-order side of the digital value is provided for each bit and basic circuits corresponding to bits on the lower-order side than the predetermined number of bits are not provided.

Here, in the charge compensation circuit 120 (401, 402), when the switch SWB (SWBS, SWB[i]) is turned on from the off state and when the switch SWC (SWBC, SWC[i]) is turned on from the off state, the charge compensation circuit 120 (401, 402) receives the supply of charge from the internal operating voltage node VRPC. This causes the voltage level to drop in the capacitor CAPB, to then cause the voltage variations at the internal operating voltage node VRPC. The amount of variations in the voltage level in the capacitor CAPB (voltage at the internal operating voltage node VRPC) increases as the capacitance value of the capacitor CAPC (CAPCS, CAPC[i]) included in the charge compensation circuit 120 (401, 402) is large. The capacitance value of the capacitor CAPC (CAPCS, CAPC[i]) is large in the charge compensation circuit 401 for sampling, and increases in the charge compensation circuit 402 for comparison operation as it corresponds to the higher-order bit of the digital value. When the capacitance value of the capacitor CAPC (CAPCS, CAPC[i]) is large, as in the case of the charge compensation circuit 401 for sampling and the circuit corresponding to the high-order bit (for example, the MSB) of the digital value in the charge compensation circuit 402 for comparison operation, such a circuit configuration as illustrated in FIG. 6A can be employed to inhibit the voltage variations at the internal operating voltage node VRPC.

Figure 6A:
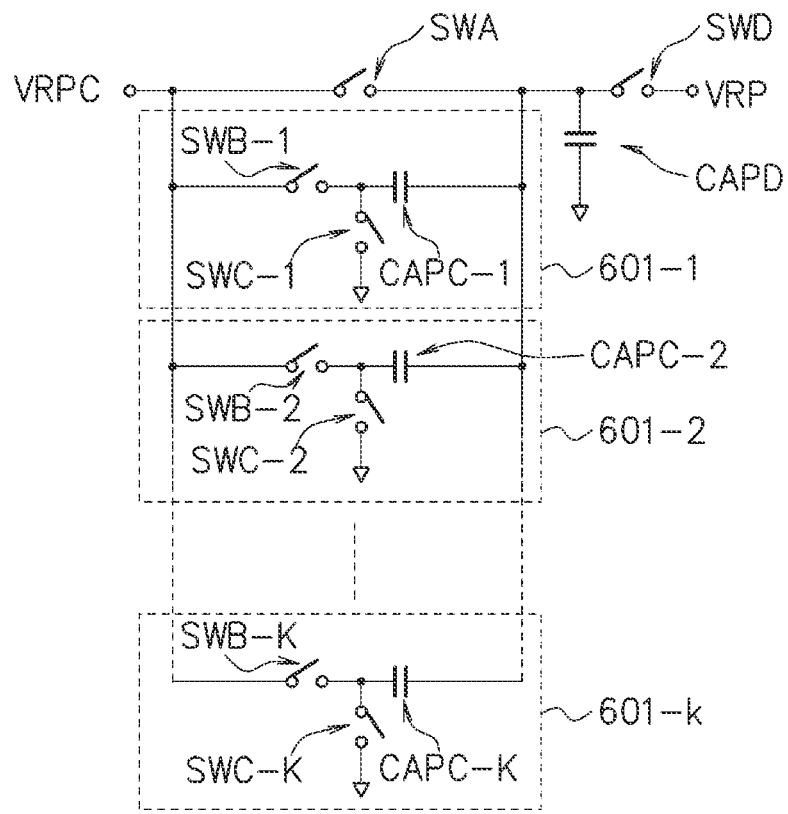
FIG. 6A is a diagram illustrating another configuration example of the charge compensation circuit.

FIG. 6A is a diagram illustrating another configuration example of the charge compensation circuit. The circuit configuration illustrated in FIG. 6A corresponds to one basic circuit in the charge compensation circuit 401 for sampling or the charge compensation circuit 402 for comparison operation. In the circuit illustrated in FIG. 6A, the capacitor corresponding to the capacitor CAPC (CAPCS, CAPC[i]) in the charge compensation circuit 120 (401, 402) is fabricated by a plurality of capacitors connected in parallel, and the capacitance value of each of the capacitors is set to be small. The charge compensation circuit illustrated in FIG. 6A includes switches SWA and SWD, a capacitor CAPD, and a plurality of internal circuits 601 (601-1, 601-2, ..., 601-k).

The switch SWA has one end thereof connected to the internal operating voltage node VRPC and has the other end thereof connected to one end of the switch SWD. The other end of the switch SWD is connected to the reference voltage input node VRP. The capacitor CAPD has one end thereof connected to a connection point between the other end of the switch SWA and one end of the switch SWD, and has the other end thereof connected to the reference potential node.

A plurality of internal circuits 601-j (j is a subscript and a natural number of =1 to k) are connected in parallel between the internal operating voltage node VRPC and one end of the switch SWD. Each of the internal circuits 601-j includes switches SWB-j and SWC-j and a capacitor CAPC-j. The switches SWB-j and SWC-j and the capacitor CAPC-j included in each of the internal circuits 601-j correspond to the switches SWB and SWC and the capacitor CAPC in the charge compensation circuit 120 illustrated in FIG. 1, respectively. In each of the internal circuits 601-j, the capacitor CAPC-j has one end (top plate) thereof connected to a connection point between the other end of the switch SWA and one end of the switch SWD. The switch SWB-j has one end thereof connected to the other end (bottom plate) of the capacitor CAPC-j and has the other end thereof connected to the reference potential node. The switch SWC-j has one end thereof connected to the other end (bottom plate) of the capacitor CAPC-j and has the other end thereof connected to the internal operating voltage node VRPC. A combined capacitance value of the capacitor CAPC-1 to the capacitor CAPC-k connected in parallel is the same as the capacitance value of the capacitor CAPC. The respective capacitors CAPC-j have, for example, the same capacitance value and each have a capacitance value of (1/k) with respect to the capacitor CAPC.

Figure 6B:
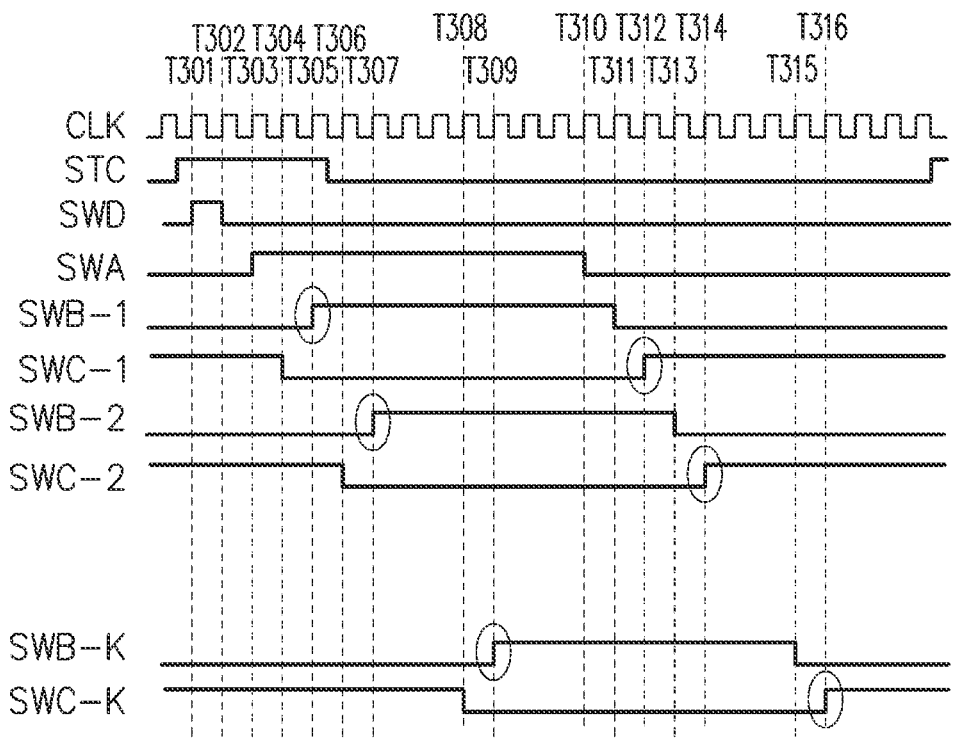
FIG. 6B is a view explaining an operation of the charge compensation circuit illustrated in FIG. 6A.

FIG. 6B is a timing chart illustrating a driving example of the charge compensation circuit illustrated in FIG. 6A. FIG. 6B illustrates a driving example in the case where the charge compensation circuit illustrated in FIG. 6A is applied to the charge compensation circuit 401 for sampling. CLK is a clock signal. STC is a control signal relating to the AD conversion operation generated by the control circuit 112. SWA, SWB-j, SWC-j, and SWD indicate the states of the switches SWA, SWB-j, SWC-j, and SWD illustrated in FIG. 6A, respectively, and a high level indicates on (closed state, conducting state) and a low level indicates off (open state, non-conducting state).

At a time T301, the switch SWD is turned on and one ends (top plates) of the capacitors CAPC-1 to CAPC-k are connected to the reference voltage input node VRP, and thereby the accumulated charge is supplied to the reference voltage input node VRP from one ends (top plates) of the capacitors CAPC-1 to CAPC-k. Thereafter, at a time T302, the switch SWD is turned off.

Then, at a time T303, the switch SWA is turned on. Subsequently, at a time T304, the switch SWC-1 in the internal circuit 601-1 is turned off, and at a time T305, the switch SWB-1 in the internal circuit 601-1 is turned on. Thereafter, at a time T306, the switch SWC-2 in the internal circuit 601-2 is turned off, and at a time T307, the switch SWB-2 in the internal circuit 601-2 is turned on. Thereafter, in the same manner, the internal switch SWC-j is turned off and then the switch SWB-j is turned on in each one of the internal circuits 601. Then, at a time T308, the switch SWC-k in the internal circuit 601-k is turned off, and at a time T309, the switch SWB-k in the internal circuit 601-k is turned on. As a result, in the internal circuits 601-1 to 601-k, the switches SWB-1 to SWB-k are turned on and the switches SWC-1 to SWC-k are turned off. In this manner, the switches are controlled to be turned on at different timings from each other, and the switches SWB-1 to SWB-k in the internal circuits 601-1 to 601-k are turned on at staggered timings, thereby making it possible to distribute the voltage variations at the internal operating voltage node VRPC and inhibit the voltage variations at the internal operating voltage node VRPC.

Then, at a time T310, the switch SWA is turned off. Then, at a time T311, the switch SWB-1 in the internal circuit 601-1 is turned off, and at a time T312, the switch SWC-1 in the internal circuit 601-1 is turned on. After that, at a time T313, the switch SWB-2 in the internal circuit 601-2 is turned off, and at a time T314, the switch SWC-2 in the internal circuit 601-2 is turned on. Thereafter, in the same manner, the internal switch SWB-j is turned off, and then the switch SWC-j is turned on in each one of the internal circuits 601. Then, at a time T315, the switch SWB-k in the internal circuit 601-k is turned off, and at a time T316, the switch SWC-k in the internal circuit 601-k is turned on. As a result, in the internal circuits 601-1 to 601-k, the switches SWB-1 to SWB-k are turned off and the switches SWC-1 to SWC-k are turned on. In this manner, the switches are controlled to be turned on at different timings from each other, and the switches SWC-1 to SWC-k in the internal circuits 601-1 to 601-k are turned on at staggered timings, thereby, making it possible to distribute the voltage variations at the internal operating voltage node VRPC and inhibit the voltage variations at the internal operating voltage node VRPC.

The example illustrated in FIG. 6B is one example, and this embodiment is not limited to this. For example, the switches SWB-j, SWC-j are controlled in the order of the internal circuits 601-1→601-2→ . . . →601-k. However, it is sufficient to turn on the switches SWB-1 to SWB-k in the internal circuits 601-1 to 601-k at staggered timings, and the internal circuits 601-1 to 601-k may be controlled in a different order. The timings of on/off control of the switch SWB-j and the switch SWC-j are made different from each other. However, it is sufficient to perform a control to turn on the switches SWB-1 to SWB-k in the internal circuits 601-1 to 601-k at staggered timings, and turn on one of the switches SWB-j and SWC-j after turning off both the switch SWB-j and the corresponding switch SWC-j, and as long as this condition is satisfied, the timing of turning off the switches SWB-j and SWC-j is arbitrary. In the example illustrated in FIG. 6B, for example, at the time T305, the switch SWB-1 in the internal circuit 601-1 may be turned on and the switch SWC-2 in the internal circuit 601-2 may be turned off, or before the time T305, the switch SWC-2 in the internal circuit 601-2 may be turned off.

There has been explained the example where the capacitors CAPC-1 to CAPC-k connected in parallel have the same capacitance value and each have a capacitance value of (1/k) with respect to the capacitor CAPC, but this embodiment is not limited to this. For example, the capacitance values of the capacitors CAPC-1 to CAPC-k may be adjusted in consideration of the influence of residual noise. When noise remains in the capacitors, the residual noise in the capacitor in the previous stage and the noise in the capacitor in the subsequent stage are superimposed, resulting in large voltage variations at the internal operating voltage node VRPC. Therefore, the capacitance values of the capacitors CAPC-j in the respective internal circuits 601-j may be set so that the capacitance value of the capacitor CAPC-j in the forefront stage is the largest and the capacitance value of the capacitor CAPC-j decreases as it goes to the later stage. For example, when controlling the switches SWB-j, SWC-j in the order of the internal circuits 601-1→601-2→ . . . →601-k, the capacitance values of the capacitors CAPC-j are designed so that the capacitance value of the capacitor CAPC-1 is the largest, the capacitance value of the capacitor CAPC-j decreases as the value of j increases, and the capacitance value of the capacitor CAPC-k becomes the smallest. This embodiment is designed so that the capacitance value of the capacitor CAPC-j becomes small according to the order in which the corresponding switches SWB-j, SWC-j are turned on, and thereby, it becomes possible to further inhibit the voltage variations at the internal operating voltage node VRPC by reducing the residual noise transmitted to the subsequent stage and suppressing the influence of the residual noise of the capacitor in the previous stage on the subsequent stage.

As described above, according to this embodiment, during the operation of the AD converter circuit unit 110, the charge compensation circuit 120 replenishes the reference voltage input node VRP with the charge intended for inhibiting the variations in the reference voltage, thereby making it possible to inhibit the variations in the reference voltage during the AD conversion operation while inhibiting an increase in circuit size. For example, as illustrated in the simulation result in FIG. 7, providing the charge compensation circuit makes it possible to inhibit the voltage variations at the reference voltage input node VRP compared to the case without providing the charge compensation circuit (a comparative example), which is clear from the voltage variations at the reference voltage input node VRP at a time T401 during resetting and at a time T402 during the comparison operation relating to the MSB.

Figure 8:
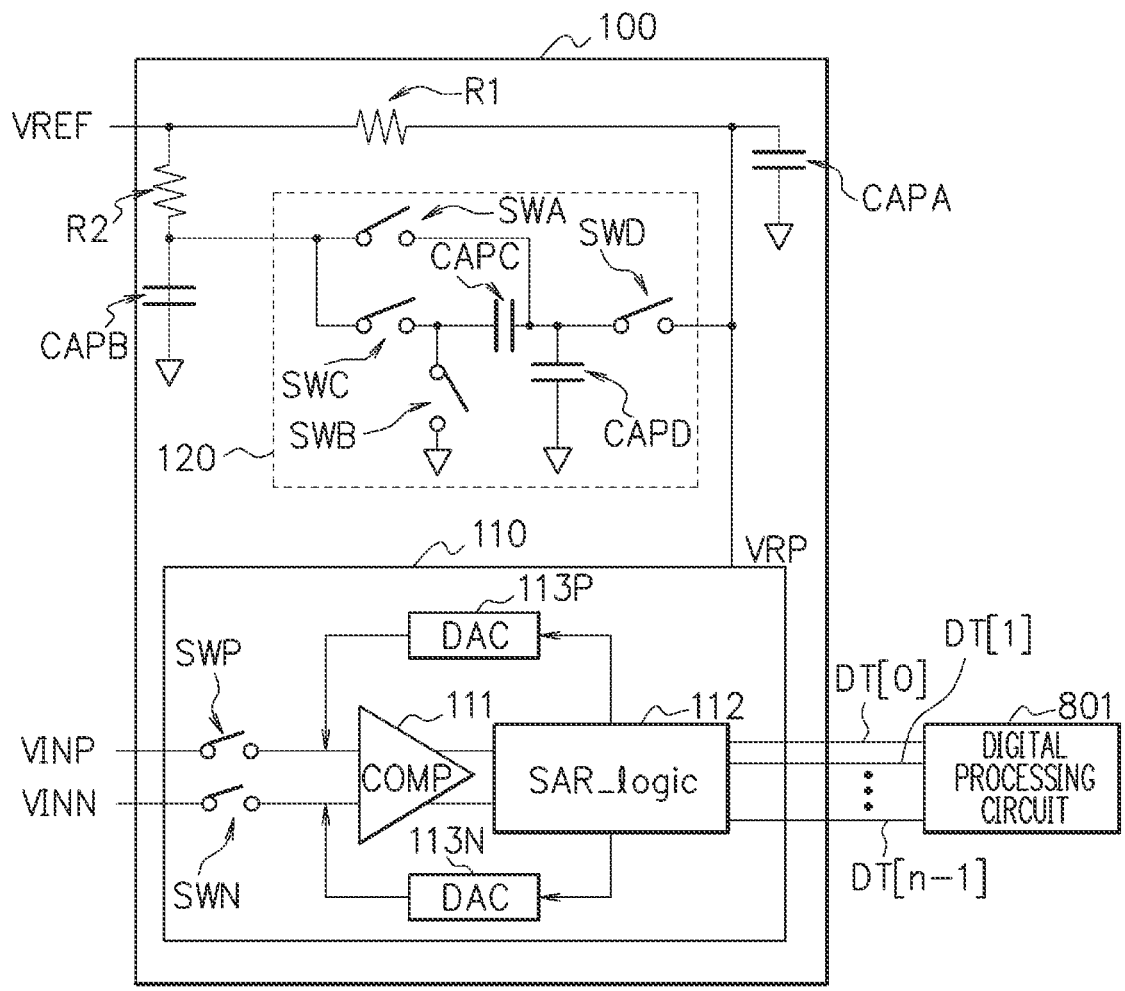
FIG. 8 is a diagram illustrating a configuration example of a semiconductor integrated circuit in this embodiment.
Figure 9:
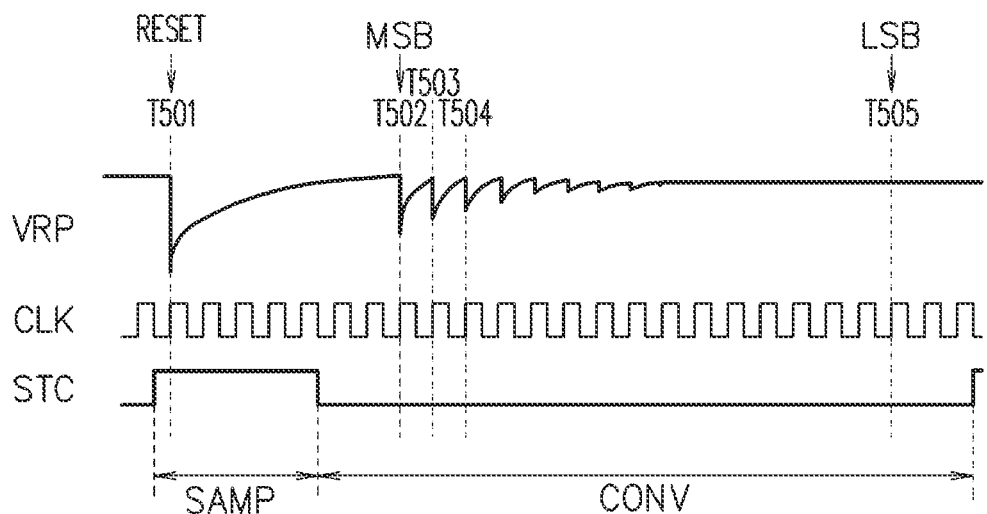
FIG. 9 is a view explaining voltage variations in the reference voltage.

FIG. 8 is a diagram illustrating a configuration example of a semiconductor integrated circuit including the AD converter circuit in this embodiment. The semiconductor integrated circuit in this embodiment includes: the SAR type AD converter circuit 100 that converts analog voltages input to the analog voltage input nodes VINP and VINN into n-bit digital values and outputs them as digital signals from the output nodes DT[0] to DT[n−1]; and a digital processing circuit 801 such as a logic circuit, which receives the digital signals output from the SAR type AD converter circuit 100 and performs digital signal processing.

The SAR type AD converter circuit 100 is the AD converter circuit in this embodiment, and includes the AD converter circuit unit 110, the charge compensation circuit 120, the resistors R1, R2, and the capacitors CAPA, CAPB. The AD converter circuit unit 110 includes the switches SWP, SWN, the comparison circuit (comparator: COMP) 111, the control circuit (SAR_logic) 112, and the capacitive DACs (CDAC) 113P, 113N. The charge compensation circuit 120 includes the four switches SWA, SWB, SWC, and SWD and the two capacitors CAPC and CAPD. The charge compensation circuit 120 is provided for each of the sampling and the comparison operation as described above. VREF is the reference voltage node. VRP is the reference voltage input node. VINP and VINN are the analog voltage input nodes. The internal circuit configuration and operation of the SAR type AD converter circuit 100 are the same as those of the SAR type AD converter circuit 100 illustrated in FIG. 1.

The digital processing circuit 801 receives the digital signals output from the SAR type AD converter circuit 100 through the output nodes DT[0] to DT[n−1], and performs processing operations and the like on the digital signals.

In the above-described embodiment, the top plate sampling type AD converter circuit has been explained as an example, but this embodiment is not limited to the top plate sampling type AD converter circuit, and can also be applied to a bottom plate sampling type AD converter circuit. Although there has been explained the example in which the input of the analog voltage is in the differential input format, this embodiment can also be applied to a single-ended input AD converter circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. An analog-to-digital converter circuit, comprising:
   a reference voltage node configured to be supplied with a reference voltage;
   an analog-to-digital converter circuit unit including a reference voltage input node configured to be electrically connected to the reference voltage node, the reference voltage being input to the reference voltage input node, the analog-to-digital converter circuit unit configured to convert an input analog voltage into a digital value based on the reference voltage;
   a voltage generation circuit configured to be electrically connected to the reference voltage node and generate an internal operating voltage based on the reference voltage; and
   a charge compensation circuit configured to receive the internal operating voltage from the voltage generation circuit, and during operation of the analog-to-digital converter circuit unit, the charge compensation circuit configured to compensate the reference voltage input node for charge generated based on the internal operating voltage.

2. The analog-to-digital converter circuit according to claim 1, wherein
   the charge compensation circuit includes:
   a first charge compensation circuit configured to compensate the reference voltage input node for charge when the analog-to-digital converter circuit unit performs a sampling operation of the input analog voltage; and
   a second charge compensation circuit configured to compensate the reference voltage input node for charge when the analog-to-digital converter circuit unit performs a comparison operation on the input analog voltage.

3. The analog-to-digital converter circuit according to claim 2, wherein
   the second charge compensation circuit includes a plurality of basic circuits configured to be connected in parallel between a node to which the internal operating voltage is supplied and the reference voltage input node, the basic circuits including the same circuit configuration as each other.

4. The analog-to-digital converter circuit according to claim 3, wherein
   the plurality of the basic circuits are configured to be provided corresponding to bits of the digital value.

5. The analog-to-digital converter circuit according to claim 3, wherein the plurality of the basic circuits are configured to be provided for each bit corresponding to a certain number of bits from the high-order side of the bits of the digital value.

6. The analog-to-digital converter circuit according to claim 1, wherein
the charge compensation circuit includes:
a first capacitor;
a first switch configured to be supplied with the internal operating voltage at one end thereof and have other end thereof connected to one end of the first capacitor;
a second switch configured to have one end thereof connected to other end of the first capacitor and have other end thereof connected to a reference potential node;
a third switch configured to be supplied with the internal operating voltage at one end thereof and have other end thereof connected to the other end of the first capacitor; and
a fourth switch configured to have one end thereof connected to the one end of the first capacitor and have other end thereof connected to the reference voltage input node.

7. The analog-to-digital converter circuit according to claim 6, wherein
at least one of the charge compensation circuits includes a plurality of internal circuits configured to be connected in parallel between a node to which the internal operating voltage is supplied and the one end of the fourth switch, each of the plurality of the internal circuits including a single one of the first capacitors, a single one of the second switches, and a single one of the third switches.

8. The analog-to-digital converter circuit according to claim 7, wherein
at least one of the charge compensation circuits includes a single one of the first switches and a single one of the fourth switches in common for the plurality of the internal circuits.

9. The analog-to-digital converter circuit according to claim 7, wherein
in the plurality of the internal circuits, the second switches are configured to be controlled to be turned on at different timings from each other and the third switches are configured to be controlled to be turned on at different timings from each other.

10. The analog-to-digital converter circuit according to according to claim 7, wherein
capacitance values of the first capacitors included in the plurality of the internal circuits are equal to each other.

11. The analog-to-digital converter circuit according to claim 7, wherein
capacitance values of the first capacitors included in the plurality of the internal circuits are different from each other.

12. The analog-to-digital converter circuit according to claim 11, wherein
the capacitance values of the first capacitors included in the plurality of the internal circuits decrease according to the order in which corresponding ones of the second switches and the third switches are turned on.

13. The analog-to-digital converter circuit according to claim 6, further comprising:
a switch control circuit configured to control the first switch, the second switch, the third switch, and the fourth switch.

14. The analog-to-digital converter circuit according to claim 1, wherein
the voltage generation circuit includes:
a resistor configured to have one end thereof electrically connected to the reference voltage node; and
a second capacitor configured to have one end thereof connected to other end of the resistor and have other end thereof connected to a reference potential node, and
the voltage generation circuit configured to output the internal operating voltage from a connection point between the other end of the resistor and the one end of the second capacitor.

15. The analog-to-digital converter circuit according to claim 1, wherein
the analog-to-digital converter circuit is a successive approximation register type analog-to-digital converter circuit.

16. A semiconductor integrated circuit, comprising:
an analog-to-digital converter circuit; and
a digital processing circuit configured to receive a digital signal output from the analog-to-digital converter circuit and then perform a processing operation, wherein
the analog-to-digital converter circuit includes:
a reference voltage node configured to be supplied with a reference voltage;
an analog-to-digital converter circuit unit including a reference voltage input node configured to be electrically connected to the reference voltage node, the reference voltage being input to the reference voltage input node, the analog-to-digital converter circuit unit configured to convert an input analog voltage into a digital value based on the reference voltage;
a voltage generation circuit configured to be electrically connected to the reference voltage node and generate an internal operating voltage based on the reference voltage; and
a charge compensation circuit configured to receive the internal operating voltage from the voltage generation circuit, and during operation of the analog-to-digital converter circuit unit, the charge compensation circuit configured to compensate the reference voltage input node for charge generated based on the internal operating voltage.

17. The semiconductor integrated circuit according to claim 16, wherein
the charge compensation circuit includes:
a first charge compensation circuit configured to compensate the reference voltage input node for charge when the analog-to-digital converter circuit unit performs a sampling operation of the input analog voltage; and
a second charge compensation circuit configured to compensate the reference voltage input node for charge when the analog-to-digital converter circuit unit performs a comparison operation on the input analog voltage.

18. The semiconductor integrated circuit according to claim 17, wherein
the second charge compensation circuit includes a plurality of basic circuits configured to be connected in parallel between a node to which the internal operating voltage is supplied and the reference voltage input node, the basic circuits including the same circuit configuration as each other.

19. The semiconductor integrated circuit according to claim 16, wherein
the charge compensation circuit includes:
a first capacitor;

a first switch configured to be supplied with the internal operating voltage at one end thereof and have other end thereof connected to one end of the first capacitor;

a second switch configured to have one end thereof connected to other end of the first capacitor and have other end thereof connected to a reference potential node;

a third switch configured to be supplied with the internal operating voltage at one end thereof and have other end thereof connected to the other end of the first capacitor; and a fourth switch configured to have one end thereof connected to the one end of the first capacitor and have other end thereof connected to the reference voltage input node.

20. The semiconductor integrated circuit according to claim 19, wherein at least one of the charge compensation circuits includes a plurality of internal circuits configured to be connected in parallel between a node to which the internal operating voltage is supplied and the one end of the fourth switch, each of the plurality of the internal circuits including a single one of the first capacitors, a single one of the second switches, and a single one of the third switches.

* * * * *